United States Patent [19]

Trimmel

[11] 4,292,606
[45] Sep. 29, 1981

[54] MODULATION CURRENT CONTROL OF LASER DIODES

[75] Inventor: Herwig Trimmel, Puchheim, Fed. Rep. of Germany

[73] Assignee: Siemens Aktiengesellschaft, Berlin & Munich, Fed. Rep. of Germany

[21] Appl. No.: 86,155

[22] Filed: Oct. 18, 1979

[30] Foreign Application Priority Data

Oct. 30, 1978 [DE] Fed. Rep. of Germany ....... 2847182

[51] Int. Cl.³ .............................................. H01S 3/096
[52] U.S. Cl. ........................... 332/7.51; 331/94.5 S; 307/312; 455/613
[58] Field of Search ............... 332/7.51; 331/94.5 S, 331/94.5 H; 307/312; 455/613, 618

[56] References Cited

U.S. PATENT DOCUMENTS

| | | | |
|---|---|---|---|
| 4,008,390 | 2/1977 | Ruge | 455/613 |
| 4,009,385 | 2/1977 | Sell | 332/7.51 |
| 4,101,847 | 7/1978 | Albenese | 331/94.5 S |
| 4,109,217 | 8/1978 | Brochett et al. | 331/94.5 S |
| 4,149,071 | 4/1979 | Nagai et al. | 332/7.51 |
| 4,166,985 | 9/1979 | White et al. | 331/94.5 H |

Primary Examiner—Nelson Moskowitz
Attorney, Agent, or Firm—Hill, Van Santen, Steadman, Chiara & Simpson

[57] ABSTRACT

A circuit which senses the time intervals during which a total current applied to a laser diode exceeds a second breakpoint value on the light-current characteristic curve and which generates an error signal that may be fed back to adjust a current modulator.

10 Claims, 3 Drawing Figures

MODULATION CURRENT CONTROL OF LASER DIODES

BACKGROUND OF THE INVENTION

1. Field of the Invention

The invention relates to a method and apparatus for controlling the modulation current applied to a laser diode which is employed as a light transmitter in a transmission stage of a signal transmission system with a light wave guide.

2. The Prior Art

Digital light wave guide transmission systems as a rule incorporate gallium-aluminum arsenide laser diodes as optical transmitters, particularly at high transmission velocities. Such laser diodes have a bent light-current characteristic curve which is illustrated, for example, in FIG. 2b. The first or lowest bend or breakpoint of the light-current characteristic curve occurs given a current which is referenced as threshold current $I_t$. A cut-in delay in the light transmission and a rectifier effect for the pulse signal current flowing through the laser diode are produced because of this threshold. Such a cut-in delay cannot be accepted, particularly in the transmission of signals with high pulse repetition frequencies. To eliminate this delay, the laser diode is supplied with a controlled preconduction or bias current Io which largely corresponds to the magnitude of the threshold current $I_t$. It is known to employ the light emitted by the back mirror of the laser diode to control of the bias current Io supplied to the laser diode. Given different aging of the two mirrors, thus, repetitive errors of necessity ensue. An arrangement for controlling the pre-conductive current of a laser diode is described in the parallel German patent application Pat. No. 28 41 433.7. (U.S. Ser. No. 073,898)

In view of the constant optical pulse output often required, it is also necessary to vary and control the modulation current supplied to the laser diode based on temperature and age dependent on parameters of the laser diode.

SUMMARY OF THE INVENTION

A method and circuit for the control of a modulation current of a light emitting laser diode with two breakpoints in its light-current characteristic curve utilize the second breakpoint on the light-current characteristic curve to generate a control signal. The control signal may be compared to a reference value and an error signal formed that can be fed back to the modulator to adjust the modulation signal.

A periodic pilot signal of a selected amplitude and frequency is superimposed on a bias current Io. Light generated by the laser diode is sensed by a photo diode. The corresponding electrical signal is amplified by a broad band amplifier and rectified. The d.c. component of the rectified signal is then removed.

The rectified signal may be compared to a reference signal in a first comparator to generate a pulse stream based on distortion due to the breakpoints in the light-current characteristic curve of the diode.

The pulse stream generated by the first comparator includes a stream of pulses associatable with distortion due to the first breakpoint in the light-current characteristic curve of the laser diode. The pulse stream generated by the first comparator also includes a stream of pulses associated with distortion due to the second breakpoint in the light-current characteristic curve of the laser diode.

A second comparator whose output is "wire ORed" to the output of the first comparator can be used to suppress the first stream of pulses.

The second stream of pulses is passed through a controlled gain amplifier to be integrated, amplified and fed back as an error signal to control and vary the modulation current.

A third comparator may be introduced to vary the reference voltage applied to the variable gain amplifier to compensate for aging and temperature variations.

The inventive method includes the steps of: generating a pulse train with each pulse having a width proportional to the duration of time during which the modulation current exceeds the current value at the second breakpoint on the light-current characteristic curve; and varying the modulation current to adjust the sensed pulse widths to a predetermined value.

DESCRIPTION OF THE PREFERRED EMBODIMENTS

Figure 1:
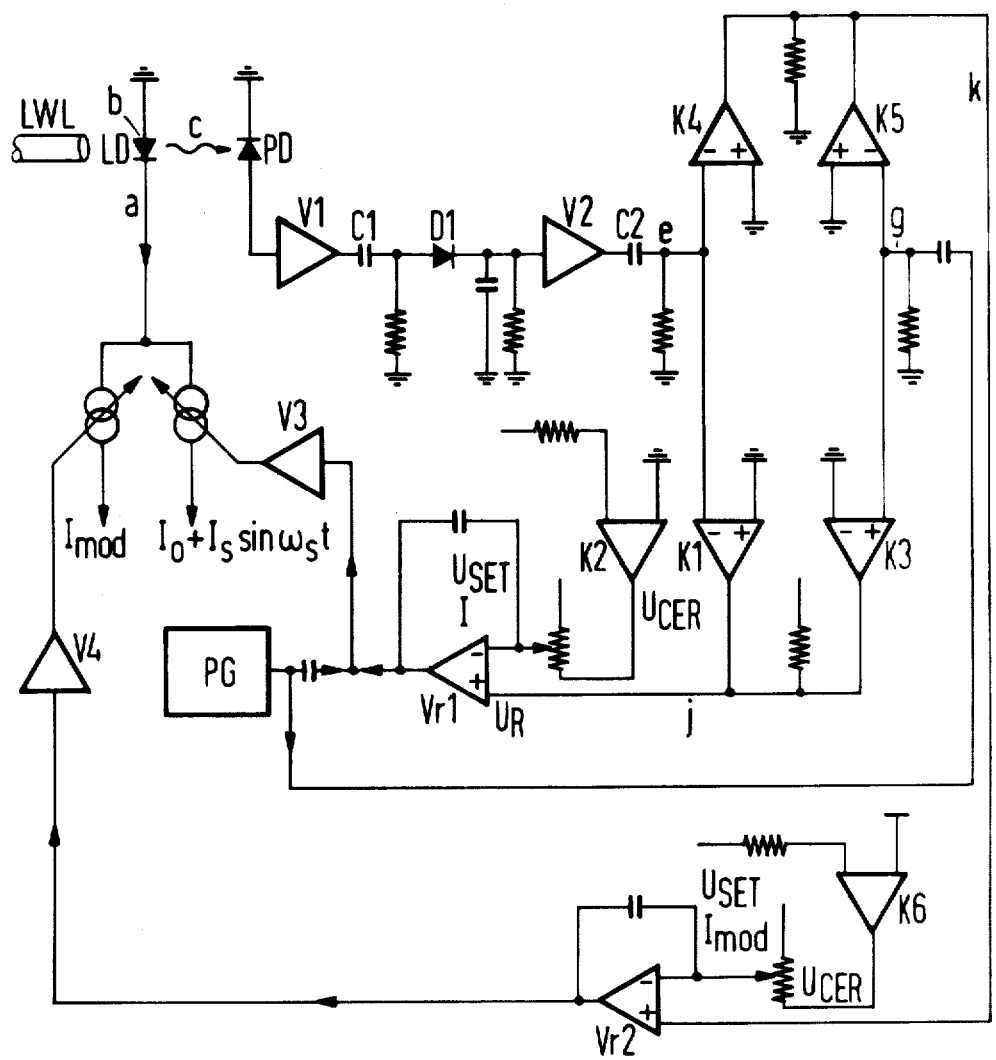
FIG. 1 is a schematic of an inventive circuit arrangement for control of the modulation current of a laser diode.
Figure 2:
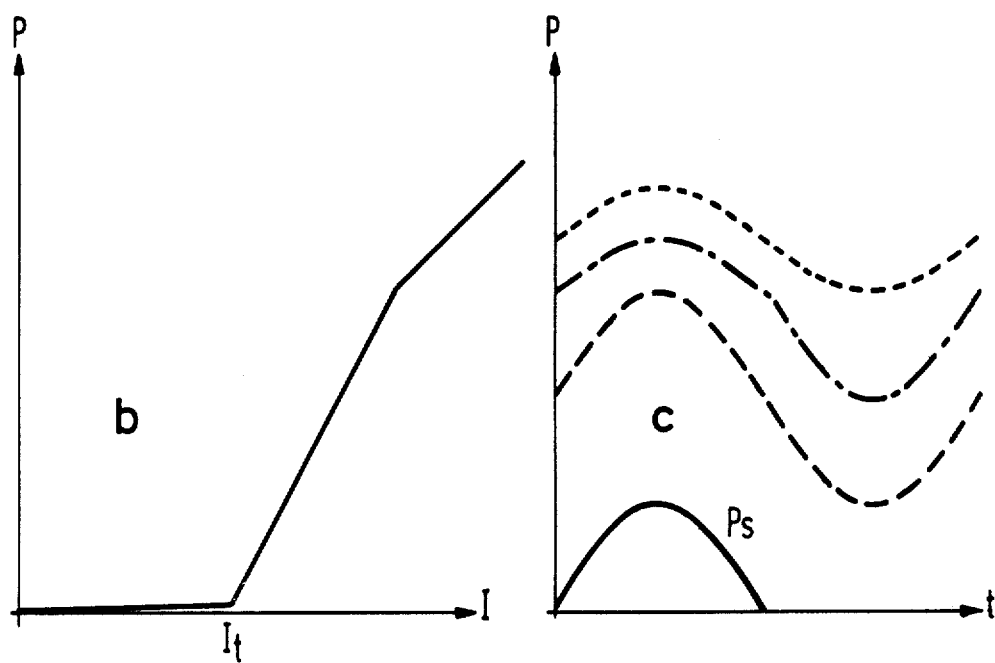
FIG. 2 is a series of envelopes of control and output signals of a laser diode as well as a laser diode light-current characteristic curve.
Figure 2:
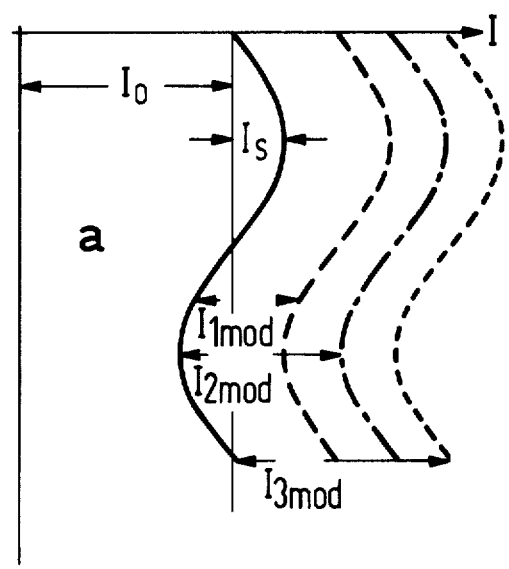
Figure 3:
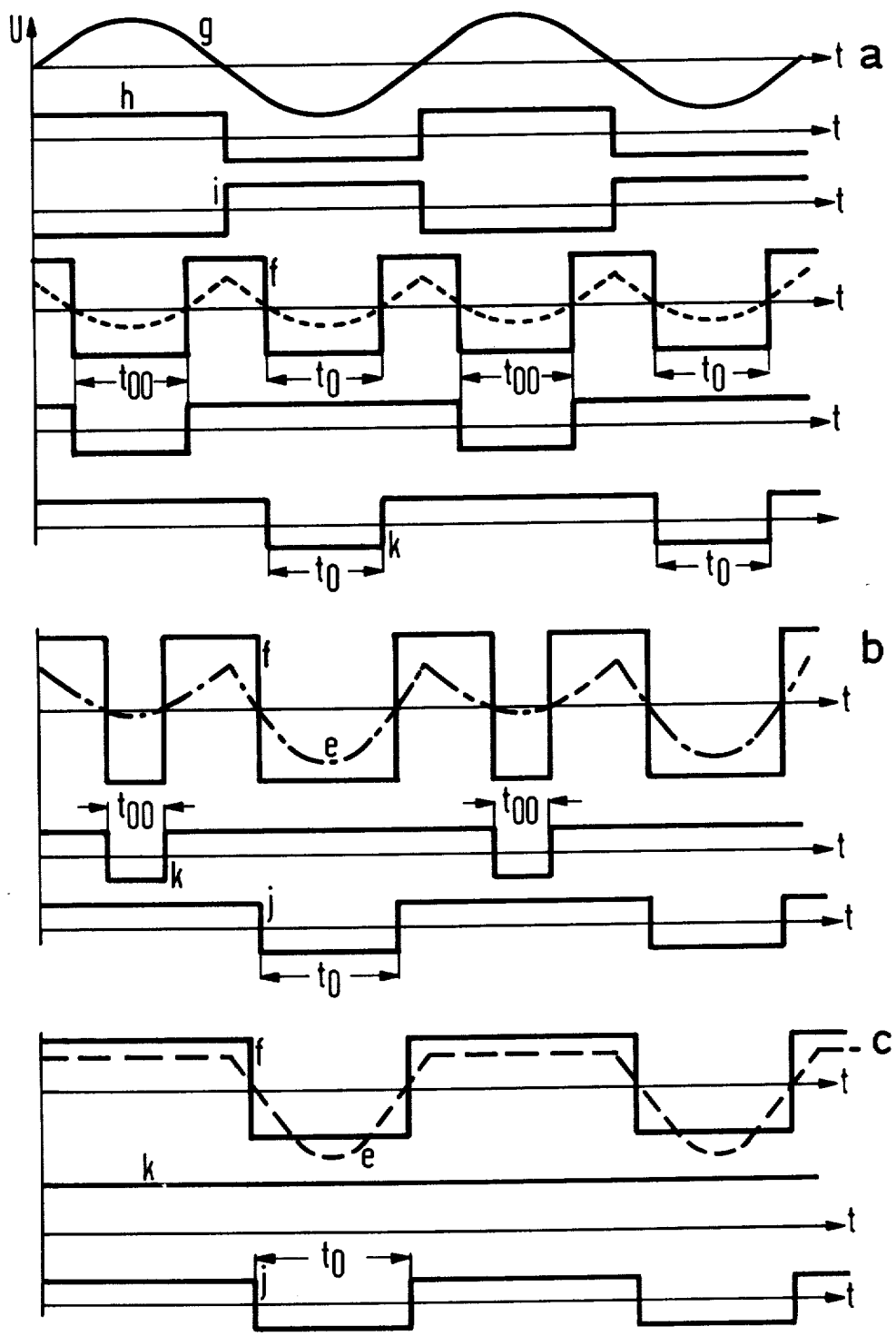
FIG. 3 is a series of waveform corresponding to the circuit of FIG. 1.

Not by way of limitation, but by way of disclosing the best mode of practicing my invention, and by way of enabling one of ordinary skill to practice my invention, there is disclosed in FIGS. 1 to 3 one illustrative embodiment of my invention.

In FIG. 1, a laser diode LD is optically connected to a light wave guide LWL. A control current is supplied at a cathode "a" of the diode LD. The control current, at the cathode "a" is illustrated in FIG. 2a. The control current is composed of a modulation current $I_{mod}$, (three values shown) a bias or a pre-conduction current Io and a pilot signal current Is. FIG. 2a is not drawn to scale. In the present case, the peak amplitude of the pilot signal current Is is selected to equal only 1% of the amplitude of the pre-conduction current Io. The frequency of the pilot signal is selected to be 10 kHz.

FIG. 2b illustrates a light-current characteristic curve of the laser diode LD with a first and a second breakpoint or bend. It follows from the combination of FIGS. 2a and 2b that distortions occur in the optical output signal of the laser diode LD. The output signal is illustrated in FIG. 2c. The pilot signal Is experiences particularly great distortions since the positive half-wave of the pilot signal Is appears in the laser diode signal Ps, but the negative half-wave of the pilot signal Is is suppressed. In accordance with the possibilities illustrated in FIG. 2a for various amplitudes of the modulation current, whereby $I_{1mod}$ represents an amplitude which is too small and $I_{3mod}$ represents an amplitude which is too large, FIG. 2c shows corresponding laser output signals of different magnitudes and with different degrees of distortion. In FIG. 2, only the respective envelopes are illustrated both for the control signals, as well as for the laser output signals.

In accordance with FIG. 1, the light "c" emitted by the laser diode LD is received by a photodiode PD. The photodiode PD converts the sensed light into an electric signal and, thus, a voltage is generated at a terminating resistance. A broadband ac amplifier V1 is connected to the terminating resistance. The amplifier V1 exhibits a relatively high low frequency cutoff by means of which the envelopes of the light signal are eliminated. As a result, only an electric signal corresponding to the high frequency pulse amplitude is further amplified. A corresponding output signal arises at the output of the amplifier V1. The signal at the output of the amplifier V1 can be peak value rectified by means of a connected diode D1 and further amplified in a second amplifier V2. Any d.c. component can be removed at node e by a capacitor C2. The waveform corresponding to the node e is shown in FIG. 3 as waveform "e" for various values of modulation current $I_{mod}$.

To control the bias current, the signal generated on line "e" is supplied to a first comparator K1 which generates an output signal on line "j" corresponding to the waveform "j" of FIG. 3. The comparator K1 is a conventional comparator adjusted such that the duration "to" of the zero pulse lies at $0.8\pi\omega_s$ of the pilot signal, and the mark-to-space ratio of the interval "to" lies at approximately 0.4 with reference to $2\pi\omega_s$ of the pilot signal. $\omega_s$ is the angular frequency of the pilot signal.

Two additional comparators K2, K3 whose outputs are connected to the inputs of a first controlled-gain amplifier Vr1 are also provided.

The output of comparator K2 is always conducting current, and, as a result always has an output voltage at the collector residual voltage. At the output of the comparator K2, the collector resistance of the transistor employed is separately illustrated, at which the reference voltage for the setting of the operating point for the controlled-gain amplifier V11 is trapped or adjusted. By means of the additional comparator K2 for generating the reference voltage, there ensues a compensation with respect to the generation of the laser diode preconduction current Io with respect to temperature changes and changes of the supply voltages.

The third comparator K3 is controlled by means of the pilot generator PG and generates a rectangular signal at its output which, during the positive half-wave of the pilot signal, is equal to logical "1" and, during the negative half-wave of the pilot signal, is equal to logical "0". By means of a connection of the outputs of the first and of the third comparators K1 and K3 in the form of a "wired OR" circuit, there ensues a desired blanking out of an interferring, additional zero pulse which is designated "too", in FIG. 3. The additional pulse designated "too" in FIG. 3 is due to the second breakpoint in the light-current curve, FIG. 2b.

The comparators K1, K2, K3 and the first controlled-gain amplifier Vr1 whose output is connected to the output of the pilot signal generator PG and to the input of a third amplifier V3 represent the significant part of the control loop for controlling the laser diode pre-conduction current. That circuit is discussed in greater detail in German Patent Application Pat. No. 28 41 433.7. (U.S. Ser. No. 073,898)

An additional control loop for controlling the modulation current is provided in FIG. 1. A fourth and, respectively, a fifth comparator K4, K5 are connected in parallel with the first and to the third comparator K1 and K3. The outputs of the fourth and the fifth comparators K4, K5 likewise are connected to one another at a line "k" in the manner of a "wired OR" circuit. In FIG. 3 the signal on the line "k" corresponds to the waveform labelled "k". The line "k" is connected as one input to a second controlled-gain amplifier Vr2. A sixth comparator K6, analogous to the second comparator K2, is connected to a second input to the amplifier Vr2 to generate a reference voltage. A controllable current source to supply the modulation current of the laser diode LD is connected to the output of the second controlled-gain amplifier Vr2 through a fourth amplifier V4.

The circuit connection between the comparator K6 and the amplifier Vr2 compensates for temperature and age variations as well as power supply fluctuations. The amplifier Vr2, in combination with an amplifier V4 amplifies and integrates the signal on the line "k" to generate an error signal. This error signal can be used to vary the magnitude of the modulation current generated by the modulator $I_{mod}$.

As can be seen from FIGS. 2 and 3, the width of the zero pulses designated "too" depends upon how far the laser diode is controlled or driven beyond the "second bend" of the light-current curve, FIG. 2b. The width of these pules can therefore fluctuate between a minimum value of zero, in case the second bend is not reached, to a maximum value which occurs upon the significant transgression of the second bend and approximately corresponds to half the period of the pilot signal which corresponds to the waveforms of FIG. 3a. The width of the zero pulses "too" can, therefore, be employed to control the modulation current. The zero pulse "to" which is suppressed by means of the wired "OR" circuit at the output of comparators K4 and K5 is disruptive of the evaluation of the zero pulse "too".

The three possibilities illustrated in FIGS. 2a and 2c are reproduced in detail above one another in FIG. 3. FIG. 3a is the case in which the modulation current, illustrated in FIG. 2a with $I_{3mod}$, is too large. Waveform "k" corresponds to the width of the zero pulse "too" and is likewise too great.

FIG. 3b illustrates the case in which the modulation current exhibits an intermediate, preferred, value in accordance with $I_{2mod}$ in FIG. 2a. In this case, the width of the zero pulses "too" has an intermediate value.

The relationships occurring when the modulation current is too small are illustrated in FIG. 3c. In this case, the modulation current corresponds to the value $I_{1mod}$ in FIG. 2a. It can be seen that in this case the zero pulse "too" is nonexistent.

Thus, by sensing the width of the pulses "too" the value of the modulation current can be continually adjusted to have an optimum value.

While various modifications or changes might be proposed by those skilled in the art it will be understood that I wish to incorporate within the claims of the patent warranted hereon all such modifications or changes as reasonably come within my contribution to the art.

I claim as my invention:

1. A method to control the modulation current supplied to a laser diode, which is employed as a light transmitter in a transmission stage of a signal transmission system with a lightwave guide, and which has a light-current characteristic curve with two breakpoints, comprising the steps of:
   supplying a bias current to the laser diode;
   superimposing a selected pilot signal on bias current;
   applying a modulation current to the laser diode such that the total current applied to the diode, for limited time intervals, exceeds the value of the current at the second breakpoint on the light-current characteristic curve;

sensing a portion of the light emitted by the laser diode;

converting the sensed portion of the light emitted by the laser diode into a corresponding electrical signal;

comparing the electrical signal to a reference signal;

forming a control signal from a selected portion of the output signal of the comparator;

adjusting the value of the modulation current based on the value of the control signal.

2. The method according to claim 1 including, between the converting and the comparing steps, the steps of:

amplifying the high-frequency components of the electrical signal;

and rectifying the amplified electrical signal.

3. A method to control the modulation current supplied to a laser diode which is employed as a light transmitter in a transmission stage of a signal transmission system with a light wave guide, comprising the steps of:

supplying a bias current to the laser diode;

superimposing a periodic oscillation, with a comparatively lower frequency and lower amplitude than the bias current, on the bias current;

sensing a part of the light emitted from the laser diode;

converting the sensed light into an electrical signal;

amplifying this electric signal in a broadband amplifier;

rectifying the amplified signal;

comparing the rectified signal with a standard signal;

generating a control signal based on a selected part of the output signal from the comparator;

controlling of the modulation current based on the control signal.

4. The method according to claim 3, characterized in that a sinusoidal oscillation is superimposed on the bias current.

5. The method according to claim 3, characterized in that the transmission signal is a digital signal.

6. The method according to claim 3, characterized in that the transmission signal is an amplitude discrete analog signal that is preferably frequency or pulse-position modulated.

7. The method according to claim 4, characterized in that the frequency of the sinusoidal oscillation substantially equals 10 kilohertz.

8. The method according to claim 4, characterized in that the amplitude of the sinusoidal oscillation amounts to approximately 1% of the amplitude of the bias current.

9. The method according to claim 3, characterized in that the rectified signal is compared with the standard signal during time intervals corresponding to the duration of negative half waves of the periodic oscillation; and in that the standard signal is derived from the periodic oscillation.

10. A method of controlling the modulation current and the bias current applied to a laser diode having two breakpoints on it's light-current characteristic curve comprising the steps of:

supplying a bias current to the laser diode;

superimposing a selected pilot signal on the bias current supplied to the laser diode;

applying a modulation current to the laser diode such that the total current applied to the diode, for limited time intervals, exceeds the value of the current at the second breakpoint on the light-current characteristic curve;

sensing a portion of the light emitted from the laser diode;

converting the sensed portion of the light emitted by the laser diode into a corresponding electrical signal;

comparing the electrical signal to a first reference signal and forming a first pulse stream with pulses whose width is proportional to the time interval during which the sum of the bias current and the pilot signal supplied to the laser diode is less than the value of current at the first breakpoint of the light-current characteristic curve;

comparing the electrical signal to a second reference signal and forming a pulse stream with pulses whose width is proportional to the time interval during which the total current supplied to the laser diode exceeds the value of current at the second breakpoint of the light-current characteristic curve;

generating a first control signal based on the first pulse stream;

generating a second control signal based on the second pulse stream;

adjusting the bias current toward an optimum value, based on the first control signal;

adjusting the modulation current toward an optimum value, based on the second control signal.

* * * * *